(12) United States Patent
Kung et al.

(10) Patent No.: US 11,784,111 B2
(45) Date of Patent: Oct. 10, 2023

(54) SEMICONDUCTOR DEVICE AND METHOD FOR MANUFACTURING THE SAME

(71) Applicant: Advanced Semiconductor Engineering, Inc., Kaohsiung (TW)

(72) Inventors: Cheng-Yuan Kung, Kaohsiung (TW); Hung-Yi Lin, Kaohsiung (TW); Chin-Cheng Kuo, Kaohsiung (TW); Wu Chou Hsu, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 18 days.

(21) Appl. No.: 17/334,569

(22) Filed: May 28, 2021

(65) Prior Publication Data
US 2022/0384309 A1 Dec. 1, 2022

(51) Int. Cl.
*H01L 23/48* (2006.01)
*H01L 21/768* (2006.01)
*H01L 25/16* (2023.01)

(52) U.S. Cl.
CPC ...... *H01L 23/481* (2013.01); *H01L 21/76898* (2013.01); *H01L 25/167* (2013.01)

(58) Field of Classification Search
CPC ..... H01L 23/48; H01L 23/481; H01L 21/768; H01L 21/76898; H01L 25/16; H01L 25/167
USPC ........................................................ 257/774
See application file for complete search history.

(56) References Cited

U.S. PATENT DOCUMENTS

| 7,741,152 B2 | 6/2010 | Huang et al. |
| 10,656,738 B1 | 5/2020 | Ho |
| 11,289,402 B2 | 3/2022 | Park et al. |
| 2004/0259292 A1 | 12/2004 | Beyne et al. |
| 2005/0087853 A1* | 4/2005 | Okumura ............ H01L 23/481 |
| | | 257/E21.597 |

(Continued)

FOREIGN PATENT DOCUMENTS

DE 10 2010 045 055 A1 3/2021

OTHER PUBLICATIONS

Non-Final Office Action for U.S. Appl. No. 17/334,571, dated Aug. 18, 2022, 10 pages.

(Continued)

*Primary Examiner* — Chuong A Luu
(74) *Attorney, Agent, or Firm* — FOLEY & LARDNER LLP

(57) ABSTRACT

A semiconductor device and a method for manufacturing the same are provided. The semiconductor device includes a semiconductor substrate, at least one conductive via, a second insulation layer and a conductive layer. The conductive via is disposed in the semiconductor substrate and includes an interconnection metal and a first insulation layer around the interconnection metal. A portion of the first insulation layer defines an opening to expose the interconnection metal. The second insulation layer is disposed on a surface of the semiconductor substrate and in the opening. The conductive layer is electrically disconnected with the semiconductor substrate by the second insulation layer and electrically connected to the interconnection metal of the at least one conductive via.

15 Claims, 13 Drawing Sheets

(56) References Cited

U.S. PATENT DOCUMENTS

| | | |
|---|---|---|
| 2006/0091431 A1* | 5/2006 | Kanzawa .......... H01L 21/76816 |
| | | 257/E21.252 |
| 2008/0230912 A1 | 9/2008 | Lee et al. |
| 2009/0026614 A1 | 1/2009 | Jung |
| 2009/0160051 A1 | 6/2009 | Lee |
| 2012/0286430 A1 | 11/2012 | Kraft et al. |
| 2013/0020468 A1 | 1/2013 | Mitsuhashi et al. |
| 2013/0221539 A1 | 8/2013 | Kraft et al. |
| 2014/0035164 A1 | 2/2014 | Moon et al. |
| 2014/0191413 A1* | 7/2014 | Minixhofer ....... H01L 21/76802 |
| | | 438/666 |
| 2015/0129942 A1 | 5/2015 | Kao |
| 2015/0131323 A1 | 5/2015 | Tsai et al. |
| 2015/0137387 A1 | 5/2015 | Choi et al. |
| 2017/0040374 A1 | 2/2017 | Oh et al. |
| 2018/0122749 A1 | 5/2018 | Lee et al. |
| 2019/0363079 A1 | 11/2019 | Thei et al. |
| 2020/0235038 A1 | 7/2020 | Adusumilli et al. |
| 2020/0273723 A1 | 8/2020 | Lee et al. |
| 2020/0343434 A1 | 10/2020 | Rubin et al. |
| 2020/0395350 A1 | 12/2020 | Wu et al. |
| 2021/0305164 A1 | 9/2021 | Tseng et al. |
| 2021/0375721 A1 | 12/2021 | Chen et al. |
| 2021/0375856 A1 | 12/2021 | Alcorn et al. |
| 2022/0014176 A1 | 1/2022 | Lan et al. |
| 2022/0084885 A1 | 3/2022 | Han et al. |
| 2022/0093461 A1 | 3/2022 | Chung et al. |
| 2022/0246567 A1 | 8/2022 | Lin et al. |

OTHER PUBLICATIONS

Notice of Allowance for U.S. Appl. No. 17/334,571, dated Dec. 9, 2022, 9 pages.

* cited by examiner

SEMICONDUCTOR DEVICE AND METHOD FOR MANUFACTURING THE SAME

BACKGROUND

1. Field of the Disclosure

The present disclosure relates to a semiconductor device including a conductive via, and to a method for manufacturing the same.

2. Description of the Related Art

In a conventional method for making a stacked semiconductor device, conductive vias are first formed in a semiconductor wafer. Then, the semiconductor wafer is thinned so that the conductive vias are exposed at both the top and bottom surfaces of the semiconductor wafer. Thereafter, a dielectric layer and a metal layer are formed in sequence on the top surface or, alternatively, on the bottom surface of the semiconductor wafer. Since the semiconductor wafer is too thin to be handled, the formations of the dielectric layer and the metal layer are difficult. Then, another element or component may be formed on or attached to the top surface or, alternatively, the bottom surface of the semiconductor wafer. Since the semiconductor wafer is too thin to be handled, the formation or attachment of such element or component are also difficult. As a result, a yield of the stacked semiconductor device is reduced.

SUMMARY

In some embodiments, a semiconductor device includes a semiconductor substrate, at least one conductive via, a second insulation layer and a conductive layer. The conductive via is disposed in the semiconductor substrate and includes an interconnection metal and a first insulation layer around the interconnection metal. A portion of the first insulation layer defines an opening to expose the interconnection metal. The second insulation layer is disposed on a surface of the semiconductor substrate and in the opening. The conductive layer is electrically disconnected with the semiconductor substrate by the second insulation layer and electrically connected to the interconnection metal of the at least one conductive via.

In some embodiments, a semiconductor device includes a semiconductor substrate, at least one conductive via and a conductive layer. The semiconductor substrate has a first surface and a second surface. The conductive via is disposed in the semiconductor substrate, and includes an interconnection metal and a first insulation layer around the interconnection metal. A portion of the first insulation layer has a first surface substantially coplanar with the first surface of the semiconductor substrate and non-coplanar with an end surface of the interconnection metal. The conductive layer is disposed adjacent to the first surface of the semiconductor substrate and electrically connected to the end surface of the interconnection metal.

In some embodiments, a method for manufacturing a semiconductor device, comprising: (a) forming at least one conductive via in a semiconductor substrate; (b) thinning the semiconductor substrate to expose the at least one conductive via; (c) forming an opening in the at least one conductive via; and (d) forming a conductive layer on the semiconductor substrate and in the opening.

BRIEF DESCRIPTION OF THE DRAWINGS

Aspects of some embodiments of the present disclosure are readily understood from the following detailed description when read with the accompanying figures. It is noted that various structures may not necessarily be drawn to scale, and dimensions of the various structures may be arbitrarily increased or reduced for clarity of discussion.

DETAILED DESCRIPTION

Figure 1:
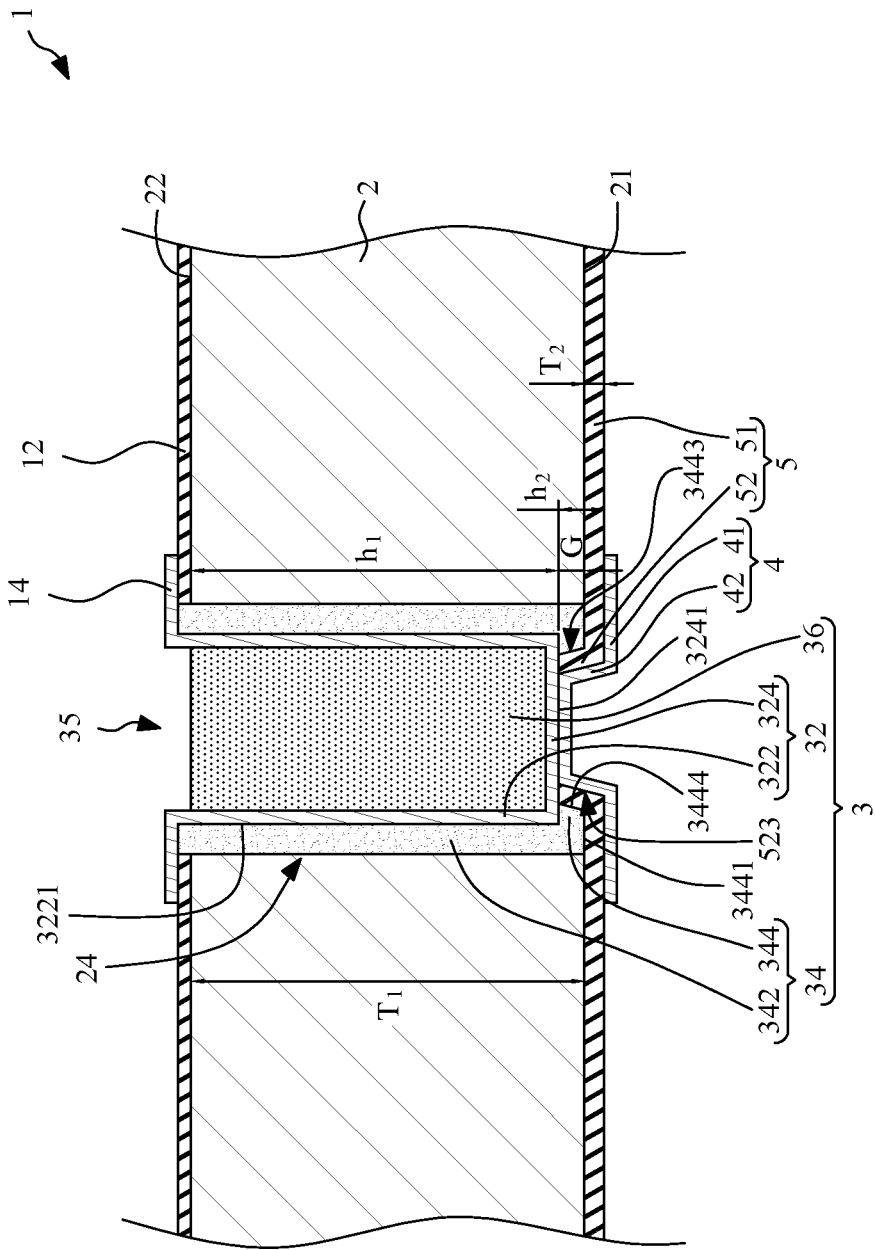
FIG. 1 illustrates a cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross-sectional view of a semiconductor device 1 according to some embodiments of the present disclosure. The semiconductor device 1 (or a conductive structure or an electronic device) may include a semiconductor substrate 2, a passivation layer 12, a conductive layer 14, at least one conductive via 3, a conductive layer 4 and a second insulation layer 5.

In some embodiments, the material of the semiconductor substrate 2 may be a semiconductor material such as silicon or germanium. However, in other embodiments, the material of the semiconductor substrate 2 may be glass. Thus, the semiconductor device 1 may be an interposer, a semiconductor wafer, a semiconductor die, or a semiconductor chip. In some embodiments, the semiconductor device 1 may be a part, an element, a component, or a device included in a semiconductor package structure. The semiconductor substrate 2 may have a first surface 21 and a second surface 22 opposite to the first surface 21, and may define a through hole 24 extending the semiconductor substrate 2 and the passivation layer 12. In some embodiments, there may be a plurality of electrical elements (e.g., transistor, resistor, capacitor, and/or transducer) embedded in the semiconductor substrate 2, and disposed adjacent to the second surface 22 of the semiconductor substrate 2. Thus, the second surface 22 of the semiconductor substrate 2 may be an active surface, and the first surface 21 of the semiconductor substrate 2 may be a backside surface.

The passivation layer 12 may be formed or disposed on the second surface 22 of the semiconductor substrate 2. A material of the passivation layer 12 may include silicon nitride or silicon oxide. The conductive layer 14 may be formed or disposed on the passivation layer 12. A material of the conductive layer 14 may include copper, gold or aluminum.

The conductive via 3 may be formed or disposed in the through hole 24 of the semiconductor substrate 2. The conductive via 3 may include an interconnection metal 32, a first insulation layer 34 and a central insulation material 36. The interconnection metal 32 may be cup-shaped, and may include an end portion 324 and a side portion 322 substantially perpendicular to the end portion 324 so as to define a central hole 35. The central insulation material 36 may be disposed in the central hole 35. In some embodiments, a material of the interconnection metal 32 may include copper, gold or aluminum. The side portion 322 of the interconnection metal 32 may connect the conductive layer 14. The end portion 324 of the interconnection metal 32, the side portion 322 of the interconnection metal 32 and the conductive layer 14 may be formed concurrently and integrally.

The end portion 324 of the interconnection metal 32 may have an end surface 3241 in contact with the conductive layer 4. The side portion 322 of the interconnection metal 32 may have a lateral side surface 3221 substantially perpendicular to the end surface 3241. As shown in FIG. 1, the end surface 3241 of the end portion 324 of the interconnection metal 32 is recessed from the first surface 21 of the semiconductor substrate 2. Thus, a gap "G" may be formed between the end surface 3241 of the end portion 324 of the interconnection metal 32 and the first surface 21 of the semiconductor substrate 2. In addition, as measured vertically through the semiconductor substrate 2 (from the second surface 22 to the first surface 21), a height "$h_1$" of the side portion 322 of the interconnection metal 32 in the semiconductor substrate 2 is less than a thickness "$T_1$" of the semiconductor substrate 2. In some embodiments, the interconnection metal 32 may be a metal solid pillar, and the central insulation material 36 may be omitted.

The first insulation layer 34 may be disposed between the interconnection metal 32 and a sidewall of the through hole 24. Thus, the first insulation layer 34 may surround or may be disposed around the interconnection metal 32. The material of the insulation circular layer 34 may include a polymer such as polyimide (PI) or polypropylene (PP) which may be the same as a material of the central insulation material 36. The first insulation layer 34 may include a first portion 342 and a second portion 344. The first portion 342 may be disposed adjacent to the lateral side surface 3221 of the side portion 322 of the interconnection metal 32. As shown in FIG. 1, the first portion 342 may be interposed between the lateral side surface 3221 of the side portion 322 of the interconnection metal 32 and the sidewall of the through hole 24. Further, the second portion 344 may be disposed adjacent to the end surface 3241 of the end portion 324 of the interconnection metal 32. As shown in FIG. 1, the second portion 344 may cover and contact the end surface 3241 of the end portion 324 of the interconnection metal 32. The second portion 344 of the first insulation layer 34 may define an opening 3443 to expose a portion of the end surface 3241 of the end portion 324 of the interconnection metal 32. That is, the conductive via 3 may define the opening 3443 recessed from the first surface 21 of the semiconductor substrate 2, and the end portion 324 of the interconnection metal 32 may be exposed in the opening 3443. As shown in FIG. 1, the second portion 344 of the first insulation layer 34 is disposed between the end surface 3241 of the interconnection metal 32 and the conductive layer 4. The opening 3443 tapers toward the end surface 3241 of the interconnection metal 32.

The second portion 344 of the first insulation layer 34 has a first surface 3441 and an inner surface 3444. The first surface 3441 of the second portion 344 is substantially coplanar with the first surface 21 of the semiconductor substrate 2, and is non-coplanar with the end surface 3241 of the interconnection metal 32. The inner surface 3444 of the second portion 344 and the end surface 3241 of the end portion 324 of the interconnection metal 32 define the opening 3443.

The second insulation layer 5 may be disposed on the first surface 21 of the semiconductor substrate 2. The material of the second insulation layer 5 may include a polymer such as polyimide (PI) or polypropylene (PP). As shown in FIG. 1, the second insulation layer 5 may include a first portion 51 and a second portion 52. The first portion 51 of the second insulation layer 5 may be disposed on the first surface 21 of the semiconductor substrate 2 and the first surface 3441 of the second portion 344 of the first insulation layer 34. The second portion 52 of the second insulation layer 5 may be disposed on and cover the inner surface 3444 of the second portion 344. That is, the second portion 52 of the second insulation layer 5 extends beyond the first surface 21 of the semiconductor substrate 2, and extends into the opening 3443 of the second portion 344 of the first insulation layer 34, and contacts the end surface 3241 of the interconnection metal 32. In other words, the second portion 52 of the second insulation layer 5 extends into the at least one conductive via 3 to contact the interconnection metal 32 of the at least one conductive via 3.

The second portion 52 of the second insulation layer 5 is disposed between the end surface 3241 of the interconnection metal 32 and the conductive layer 4. It is noted that the second portion 52 of the second insulation layer 5 may not cover the end surface 3241 of the end portion 324 of the interconnection metal 32. The end surface 3241 of the end portion 324 of the interconnection metal 32 may be exposed from the second portion 52 of the second insulation layer 5. In some embodiments, the second portion 52 of the second insulation layer 5 in the opening 3443 may define a through hole (or a cavity) 523 to expose a portion of the end surface 3241 of the interconnection metal 32.

The conductive layer 4 (e.g., a metal layer) may be disposed adjacent to the first surface 21 of the semiconductor substrate 2 and electrically connected to the end surface 3241 of the interconnection metal 32. In some embodiments, a material of the conductive layer 4 may include copper, gold or aluminum. The conductive layer 4 is disposed on the second insulation layer 5. That is, the second insulation layer 5 may be interposed between the second portion 344 of the first insulation layer 34 and the conductive layer 4, and between the semiconductor substrate 2 and the conductive layer 4. The conductive layer 4 may be electrically isolated from the semiconductor substrate 2 through the second insulation layer 5 and electrically connected to the interconnection metal 32 of the at least one conductive via 3 As shown in FIG. 1, the conductive layer 4 may include a main portion 41 and a via portion 42. The main portion 41 may be disposed adjacent to the first surface 21 of the semiconductor substrate 2, and may be disposed on the first portion 51 of the second insulation layer 5. The via portion 42 may connect the main portion 41 and the at least one conductive via 3. For example, the via portion 42 of the conductive layer 4 may be disposed in the opening 3443 of the second portion 344 of the first insulation layer 34 to contact and electrically connect the exposed portion of the end surface 3241 of the end portion 324 of the interconnection metal 32. Alternatively, the via portion 42 of the conductive layer 4 may be disposed in the through hole 523 of the second insulation layer 5 to contact the exposed portion of the end surface 3241 of the interconnection metal 32.

As shown in FIG. 1, the via portion 42 of the conductive layer 4 extends beyond the first surface 21 of the semiconductor substrate 2, and a height "$h_2$" of the via portion 42 is greater than a thickness "$T_2$" of the second insulation layer 5. That is, the via portion 42 of the conductive layer 4 extends into the at least one conductive via 3 to contact the end surface 3241 of the interconnection metal 32. The via portion 42 of the conductive layer 4 tapers toward the interconnection metal 32 of the at least one conductive via 3. The second portion 344 of the first insulation layer 34 surrounds or is disposed around the via portion 42 of the conductive layer 4.

Figure 2:
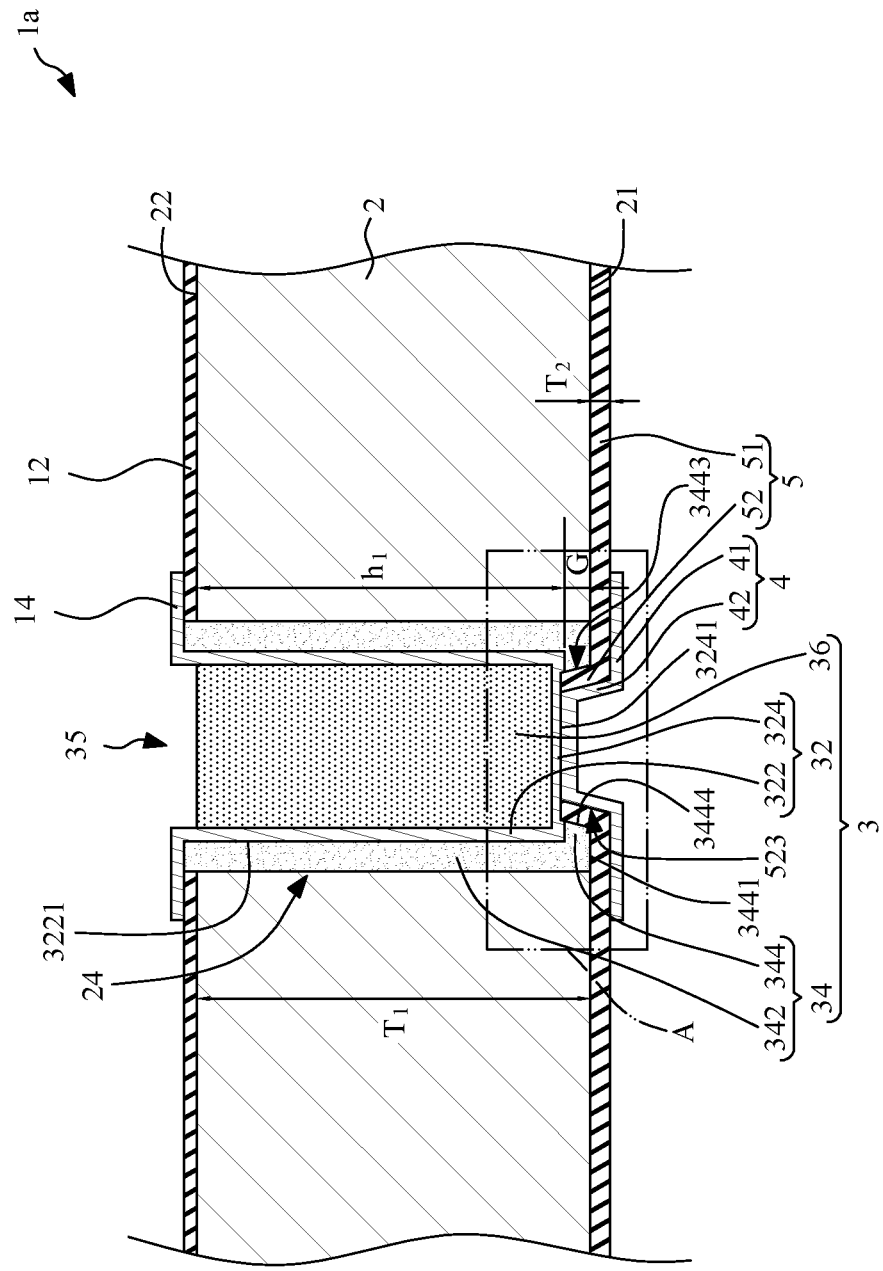
FIG. 2 illustrates a cross-sectional view of a semiconductor device according to some embodiments of the present disclosure.
Figure 3:
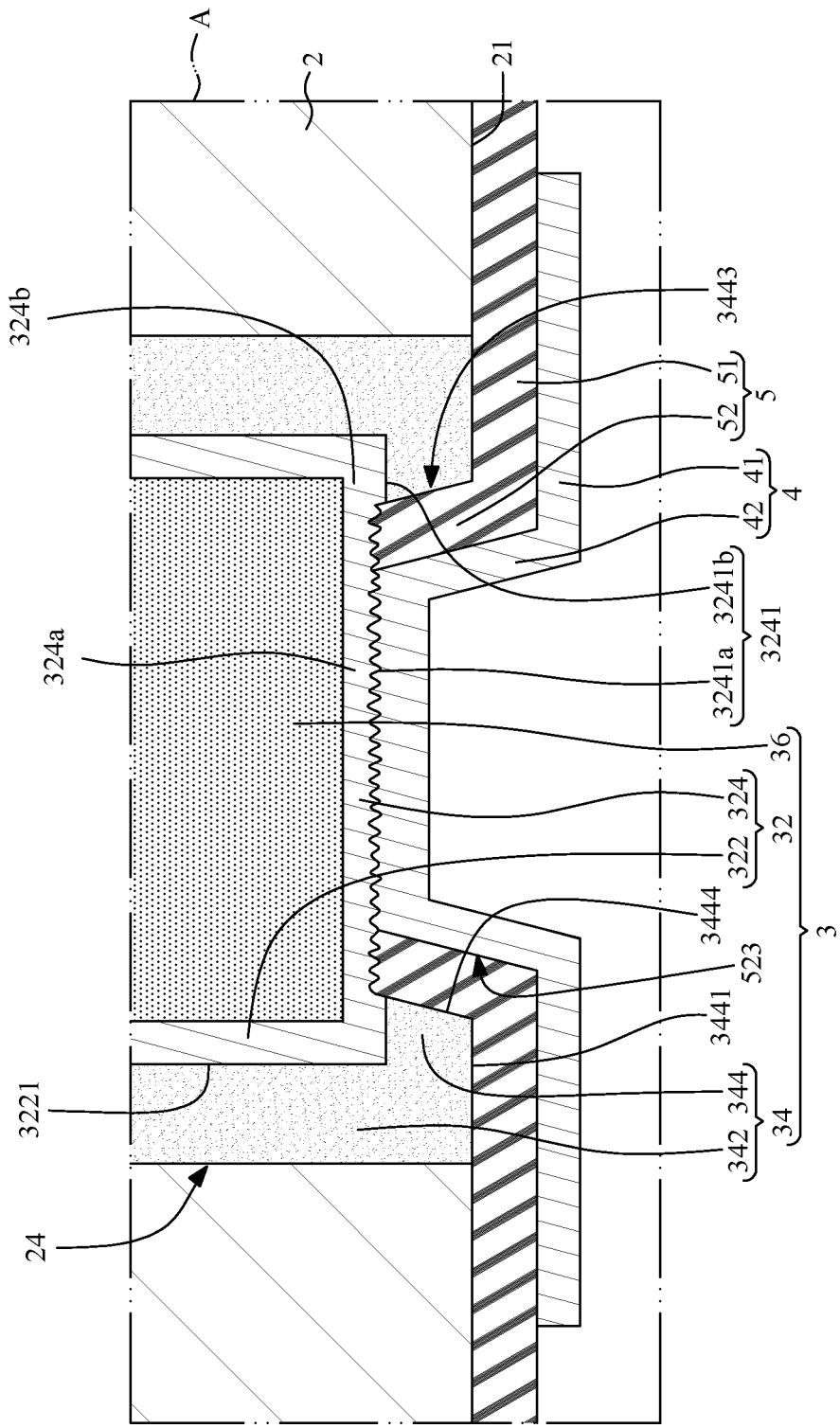
FIG. 3 illustrates an enlarged view of a region "A" of FIG. 2.

FIG. 2 illustrates a cross-sectional view of a semiconductor device 1a according to some embodiments of the present disclosure. FIG. 3 illustrates an enlarged view of a region "A" of FIG. 2. The semiconductor device 1a of FIG. 2 is similar to the semiconductor device 1 of FIG. 1, except that the surface condition of the end surface 3241 of the end portion 324 of the interconnection metal 32 of the at least one conductive via 3. As shown in FIG. 3, the end portion 324 of the interconnection metal 32 includes a first portion 324a corresponding to the opening 3443 of the second portion 344 of the first insulation layer 34 and a second portion 324b outside the first portion 324a. Thus, the end surface 3241 of the end portion 324 of the interconnection metal 32 includes a first portion 3241a corresponding to the first portion 324a, and a second portion 3241b corresponding to the second portion 324b and outside the first portion 3241a. In some embodiments, the opening 3443 of the second portion 344 of the first insulation layer 34 may be formed by laser drilling, thus, the first portion 324a of the end portion 324 of the interconnection metal 32 may be served as a stop portion during the laser drilling. As a result, a surface roughness of the exposed portion (i.e., the first portion 3241a) of the end surface 3241 of the interconnection metal 32 may be different from a surface roughness of a portion (i.e., the second portion 3241b) outside the exposed portion (i.e., the first portion 3241a) of the end surface 3241. For example, the surface roughness of the exposed portion (i.e., the first portion 3241a) of the end surface 3241 may be greater than the surface roughness of the portion (i.e., the second portion 3241b) outside the exposed portion (i.e., the first portion 3241a) of the end surface 3241. In addition, a thickness of the first portion 324a of the end portion 324 of the interconnection metal 32 may be less than a thickness of the second portion 324b of the end portion 324 of the interconnection metal 32.

Figure 4:
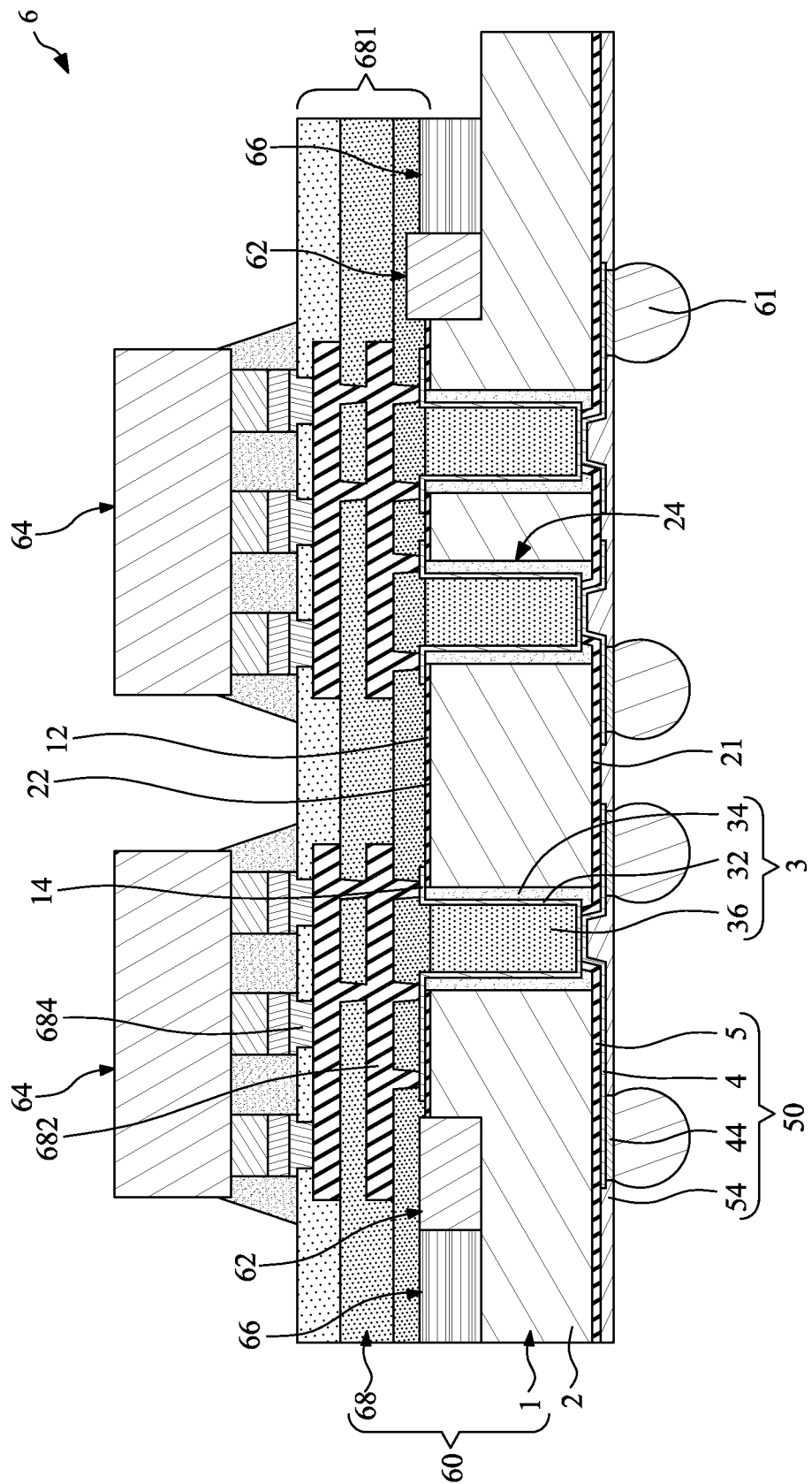
FIG. 4 illustrates a cross-sectional view of an optical communication package structure according to some embodiments of the present disclosure.

FIG. 4 illustrates a cross-sectional view of an optical communication package structure 6 according to some embodiments of the present disclosure. The optical communication package structure 6 includes a wiring structure 60, at least one conductive via 3, a redistribution structure 50, at least one optical device 62, at least one electrical device 64, at least one waveguide 66 and a plurality of solder bumps 61. In some embodiments, the optical communication package structure 6 may be a photonic-electronic hybrid package structure.

The wiring structure 60 includes a main portion 1 and a conductive structure 68. The main portion 1 is same as or similar to the semiconductor device 1 of FIG. 1. The conductive structure 68 is disposed adjacent to the second surface 22 of the semiconductor substrate 2. The conductive structure 68 includes a dielectric structure 681, at least one circuit layer 682 and a plurality of metal bumps 684. The dielectric structure 681 covers the passivation layer 12, and includes a plurality of dielectric layers stacked on one another. The at least one circuit layer 682 is embedded in the dielectric layers of the dielectric structure 681. In some embodiments, the conductive structure 68 may include a plurality of circuit layers 682 electrically connected to each other through a plurality of inner vias. The metal bumps 684 are disposed adjacent to an upper surface of the conductive structure 68, and may protrude from the upper surface of the conductive structure 68.

The conductive via 3 is disposed in the at least one through hole 24 of the semiconductor substrate 2 and electrically connected to the conductive structure 68. The conductive via 3 may include an interconnection metal 32, a first insulation layer 34 and a central insulation material 36 as shown in FIG. 1. The interconnection metal 32 of the conductive via 3 may be electrically connected to the optical device 62 through the conductive layer 14.

The redistribution structure 50 is disposed on the first surface 21 of the semiconductor substrate 2 and electrically connected to the conductive via 3. The redistribution structure 50 may include the second insulation layer 5, the patterned conductive layer 4, a plurality of bonding pads 44 and a protection layer 54. The second insulation layer 5 is disposed on the first surface 21 of the semiconductor substrate 2. The patterned conductive layer 4 is disposed on the second insulation layer 5 and electrically connected to the interconnection metal 32 of the conductive via 3. The bonding pads 44 are disposed on and electrically connected to the patterned conductive layer 4. The protection layer 54 covers the patterned conductive layer 4 and the second insulation layer 5.

The optical device 62 may be, for example, a photo detector, a laser diode or a modulator. The optical device 62 is disposed adjacent to the second surface 22 of the semiconductor substrate 2. In some embodiments, the dielectric structure 681 of the conductive structure 68 may cover the optical device 62. In some embodiments, the optical device 62 may be disposed adjacent to the boundary between the dielectric structure 681 of the conductive structure 68 and the main portion 1. Thus, the optical device 62 may be embedded in the dielectric structure 681 of the conductive structure 68 and/or the main portion 1.

The electrical device 64 may be, for example, a transimpedance amplifier (TIA) or a driver. The electrical device 64 is disposed on and electrically connected to the conductive structure 68 by flip-chip bonding. In some embodiments, the electrical device 64 may be bonded to the metal bumps 684 of the conductive structure 68. In some embodiments, the electrical device 64 may perform vertical electrical connection through the conductive via 3 and the redistribution structure 50, thereby resulting in an increase in transmission speed while power consumption may be decreased. This is due to the conductive via 3 and the redistribution structure 50 shorten the electrical transmission path. In addition, the conductive via 3 and the redistribution structure 50 may reduce a volume of the optical communication package structure 6 about 30%.

The waveguide 66 is disposed adjacent to an upper surface of the main portion 1 and corresponds to the optical device 62. In some embodiments, the dielectric structure 681 of the conductive structure 68 may cover the waveguide 66. An end of the waveguide 66 may be exposed from a lateral side surface of the dielectric structure 681 of the conductive structure 68.

The solder bumps 61 (e.g., solder balls) are mounted on the bonding pads 44 of the redistribution structure 50 for external connection.

Figure 5:
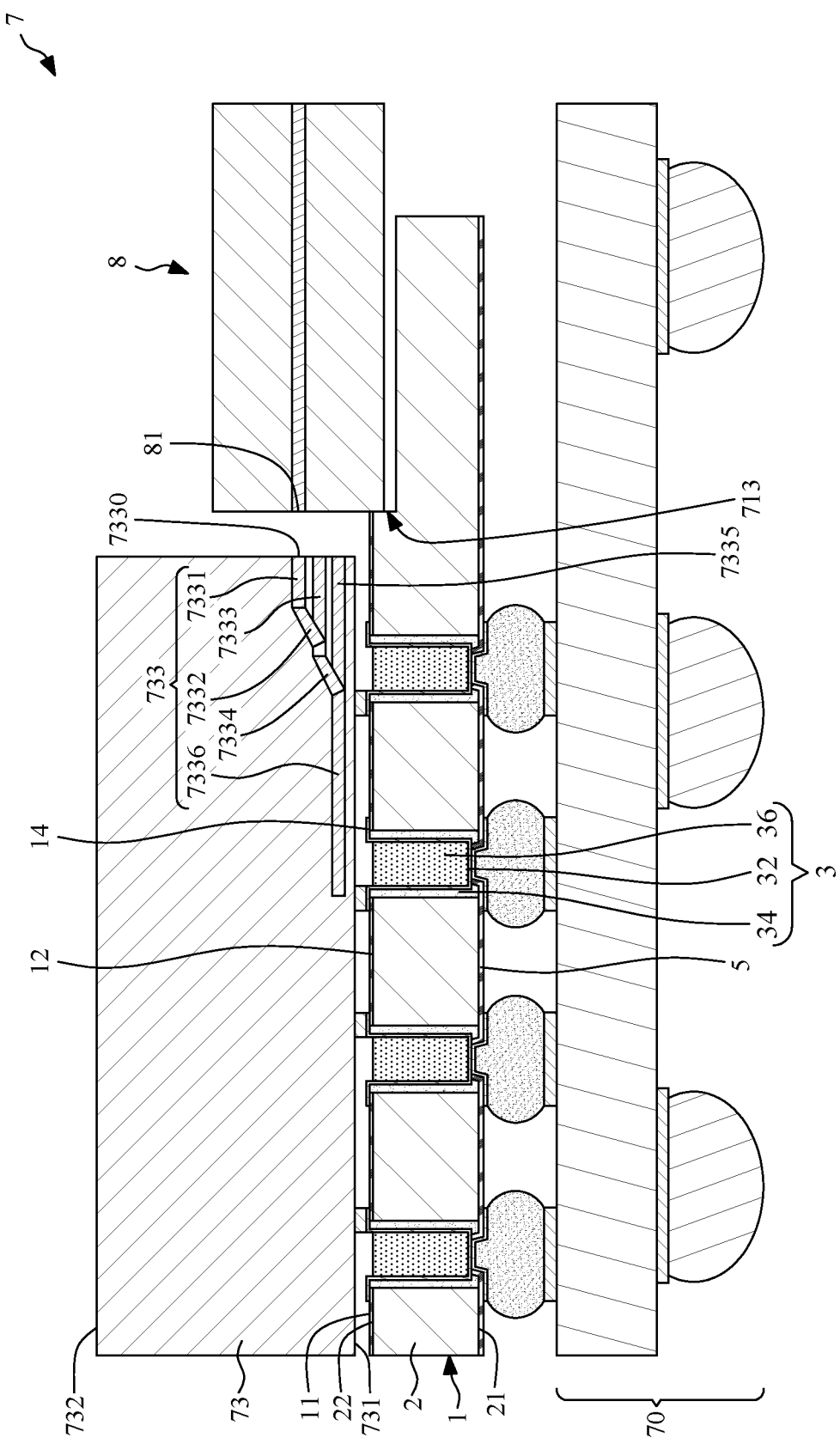
FIG. 5 illustrates a cross-sectional view of an optoelectronic structure in accordance with some embodiments of the present disclosure.

FIG. 5 illustrates a cross-sectional view of an optoelectronic structure 7 in accordance with some embodiments of the present disclosure. In some embodiments, the optoelectronic structure 7 includes a substrate 70, an electronic die 1 and a photonic die 73. The substrate 70 may include a conductive substrate with circuitry formed therein. The substrate 70 may be electrically connected to the electronic die 71, and configured to build an electrical connection to an external electronic component such as a printed circuit board (PCB). In some embodiments, the electronic die 1 is same as or similar to the semiconductor device 1 of FIG. 1. The electronic die 1 receives power from the substrate 70 and then provides a driving signal to the photonic die 73. The electronic die 1 is disposed on the substrate 70 and has a first surface 11, wherein the first surface 11 is configured to support an optical component 8. The photonic die 73 is disposed on the first surface 11 of the electronic die 1 and has an active surface 731 toward the first surface 11 of the electronic die 1 and a side surface facing the optical component 8. In some embodiments, the electronic die 1 may include a trench 713 recessed from the first surface 11 for positioning the optical component 8.

In some embodiments, the electronic die 1 includes a conductive via 3 for electrically connecting the first surface 11 of the electronic die 1 to the substrate 70. To maintain the structural integrity of the electronic die 1 and sufficiently position the optical component 8, in some embodiments, a depth of the trench 713 is about one sixth to about one fifth of a radius of the optical component 8.

In some embodiments, the optical component 8 comprises an optical fiber. In cases of complex optical transmission systems, optical interconnects between optical fiber and the photonic dies happen frequently in the whole system, so efficient fiber-to-chip coupling is an important factor to pay attention to for system performance. The size of optical waveguides in the photonic die can be as tiny as about 1 μm while the typical diameter of a single mode fiber (SMF) is around 125 μm with a core diameter near 10 μm. The huge size mismatch between a fiber core and the optical waveguide often causes considerable optical transmission loss when light emitting from the core of the optical fiber enters the silicon optical waveguide directly or when light emitting from the silicon optical waveguide enters the core of the optical fiber directly. Therefore, it is important to deal with such issue in optical interconnects.

In some embodiments, the photonic die 73 includes an optical waveguide 733 exposed from the side surface of the photonic die 73 for coupling lights from or into the optical component 8. In some embodiments, an end 7330 of the optical waveguide 733 near the optical component 8 is exposed from the side surface of the photonic die 73 for transferring lights from or into the optical component 7. In some embodiments, a geometric center (e.g., a core) 81 of the optical component 8 is substantially aligned with the end 7330 in the optical waveguide 733. In some embodiments, the optical waveguide 333 comprises a plurality of waveguides 7331-7336 at different levels of the photonic die 73, wherein each waveguide of the plurality of waveguides 7331-7336 is coupled with at least another waveguide of the plurality of waveguides 7331-7336, wherein the end 7330 of the optical waveguide 733 is at a level substantially aligned with the core 81 of the optical component 8. In some embodiments, the plurality of waveguides 7331-7336 transfer lights from the optical component 8 to the active surface 731 of the photonic die 73. In some embodiments, the plurality of waveguides 7331-7336 transfer lights from the active surface 731 of the photonic die 73 into the optical component 8. The plurality of waveguides 7331-7336 forms a stepped structure. The stepped structure of the plurality of waveguides 7331-7336 helps transfer lights at different levels of the photonic die 73 to other levels of the photonic die 73 so that the end 7330 of the optical waveguide 733 can be aligned with the core 81 of the optical component 8.

In some embodiments, the plurality of waveguides 7331-7336 includes the waveguide 7331, waveguide 7333 and waveguide 7335, each at a respective level of the photonic die 73 and exposed from the side surface of the photonic die 73. By exposing the waveguide 7331, waveguide 7333 and waveguide 7335 at different levels of the side surface of the photonic die 73, the optical waveguide 733 can transfer lights from or into the optical component 8 even if the core 81 of the optical component 8 is not precisely aligned with one of the waveguide 7331, waveguide 7333 and waveguide 7335. In some embodiments, the waveguide 7331 is coupled to the waveguide 7333 through the waveguide 7332. The waveguide 7332 is a tilted waveguide for transferring lights between waveguides in different levels of the photonic die 73. In some embodiments, the waveguide 7333 is coupled to the waveguide 7335 through the waveguide 7334. The waveguide 7334 is a tilted waveguide for transferring lights between waveguides in different levels of the photonic die 73. In some embodiments, the tilted angle of the waveguides 7332 and 7334 is around 10 to 15 so as to minimize the transmission loss. In some embodiments, the waveguide 7336 collects light from the waveguides 7331-7335 or provide lights to the waveguides 7331-7335.

The trench 713 can also help aligning the core 81 of the optical component 8 with the end 7330 of the optical waveguide 733. If there is not any trench on the electronic die 1 for positioning the optical component 8, the level difference between the core 81 of the optical component 8 and the active surface 731 of the photonic die 73 will be larger and more waveguides at different levels of the photonic die 73 will be needed to transfer light between the core 81 of the optical component 8 and the active surface 731 of the photonic die 73.

FIG. 6 through FIG. 10 illustrate a method for manufacturing a semiconductor device according to some embodiments of the present disclosure. In some embodiments, the method is for manufacturing the semiconductor device 1 shown in FIG. 1.

Figure 6:
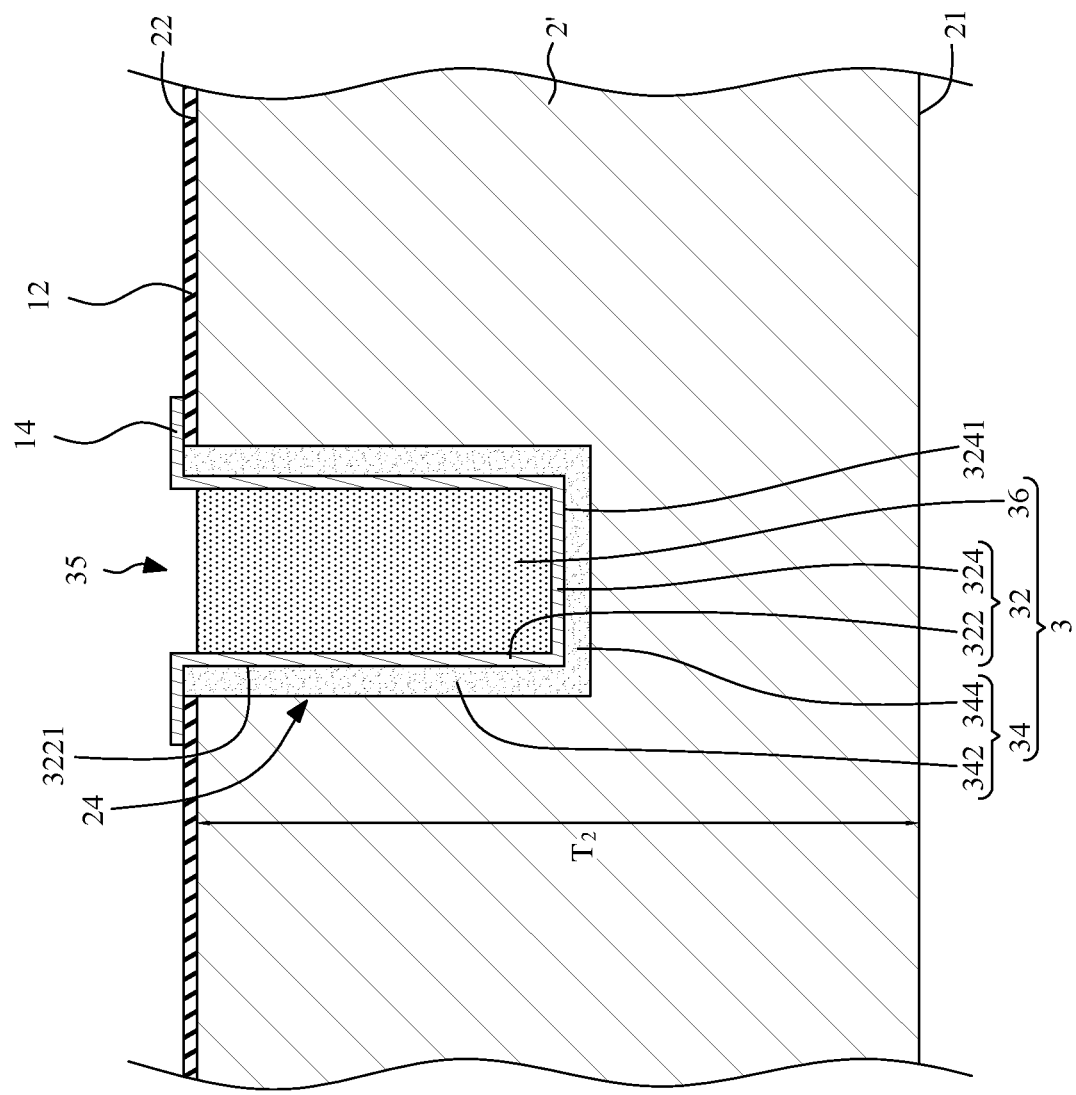
FIG. 6 illustrates one or more stages of an example of a method for manufacturing a semiconductor device according to some embodiments of the present disclosure.

Referring to FIG. 6, a wafer is provided. The wafer may include a semiconductor substrate 2' and the dielectric layer 12. The semiconductor substrate 2' has a first surface 21 and a second surface 22. The semiconductor substrate 2' has a thickness $T_2$. The passivation layer 12 may be formed or disposed on the second surface 22 of the semiconductor substrate 2'. Then, a cylindrical blind hole 24 is formed from the second surface 22 of the semiconductor substrate 2' by etching. Then, a first insulation layer 34 is formed or disposed in the cylindrical blind hole 24. Then, a central portion of the first insulation layer 34 is removed so as to form a cylindrical cavity. Then, a conductive layer is formed or disposed in the cylindrical cavity of the first insulation layer 34 and on the passivation layer 12. The conductive layer on the passivation layer 12 is defined as a conductive layer 14. The conductive layer in the cylindrical cavity of the first insulation layer 34 is defined as an interconnection metal 32. The interconnection metal 32 may be cup-shaped and may include an end portion 324 and a side portion 322 substantially perpendicular to the end portion 324 so as to define a central hole 35. Then, a central insulation material 36 may be disposed in the central hole 35. Thus, a conductive via 3 is formed in the wafer or the semiconductor substrate 2'.

The end portion 324 of the interconnection metal 32 may have an end surface 3241. The side portion 322 of the interconnection metal 32 may have a lateral side surface 3221 substantially perpendicular to the end surface 3241. The first insulation layer 34 may include a first portion 342 and a second portion 344. The first portion 342 may be interposed between the lateral side surface 3221 of the side portion 322 of the interconnection metal 32 and the sidewall of the blind hole 24. The second portion 344 may cover and contact the end surface 3241 of the end portion 324 of the interconnection metal 32.

Figure 7:
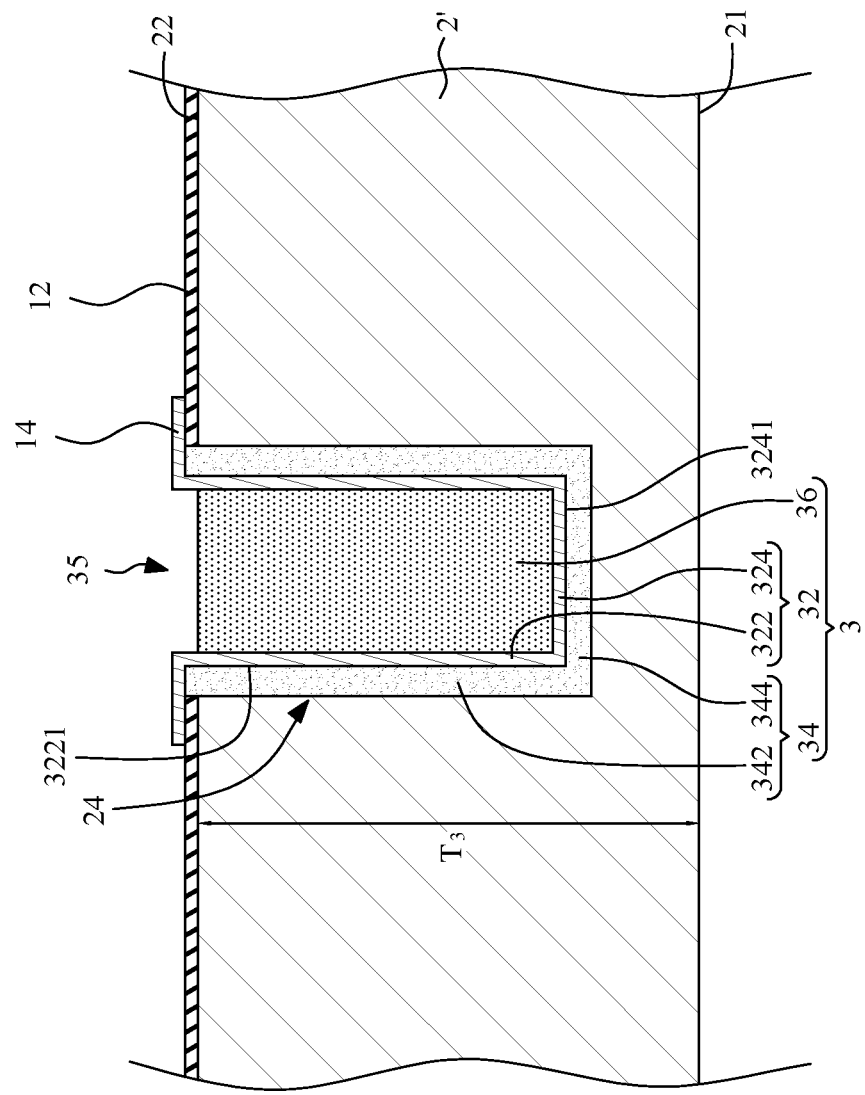
FIG. 7 illustrates one or more stages of an example of a method for manufacturing a semiconductor device according to some embodiments of the present disclosure.

Referring to FIG. 7, the semiconductor substrate 2' is thinned from the first surface 21 of the semiconductor substrate 2' by, for example, fast grinding. Meanwhile, a thickness of the semiconductor substrate 2' is reduced to "$T_3$".

Figure 8:
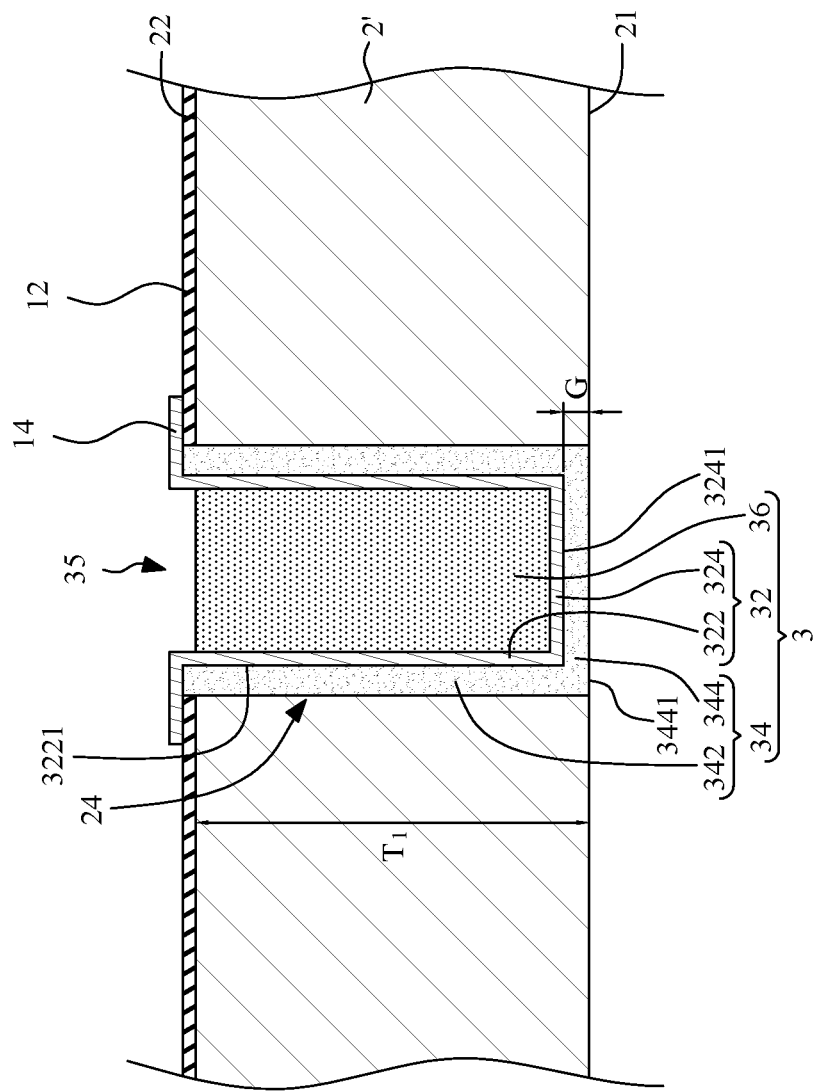
FIG. 8 illustrates one or more stages of an example of a method for manufacturing a semiconductor device according to some embodiments of the present disclosure.

Referring to FIG. 8, the semiconductor substrate 2' is further thinned from the first surface 21 of the semiconductor substrate 2' by, for example, slow grinding, to expose the conductive via 3. Meanwhile, a thickness of the semiconductor substrate 2' is reduced to "$T_1$". The removing rate of the slow grinding of FIG. 8 is less than the removing rate of the fast grinding of FIG. 7. As shown in FIG. 8, the second portion 344 of the first insulation layer 34 is exposed from the first surface 21 of the semiconductor substrate 2', and will not be further removed. Thus, a first surface 3441 of the second portion 344 of the first insulation layer 34 is substantially coplanar with the first surface 21 of the semiconductor substrate 2'. In the illustrated embodiment, the slow grinding of FIG. 8 may only remove a portion of semiconductor substrate 2', thus, reliability and yield of the grinding process is ensured, and a life of the grinding pad (or polishing pad) or grinding wheel is improved. In a comparative embodiment, a portion of semiconductor substrate 2' together with the second portion 344 of the first insulation layer 34 and a portion of the end portion 324 of the interconnection metal 32 may be removed concurrently, thus, reliability and yield of the grinding process is relatively low, and a life of the grinding pad (or polishing pad) or grinding wheel is reduced.

Figure 9:
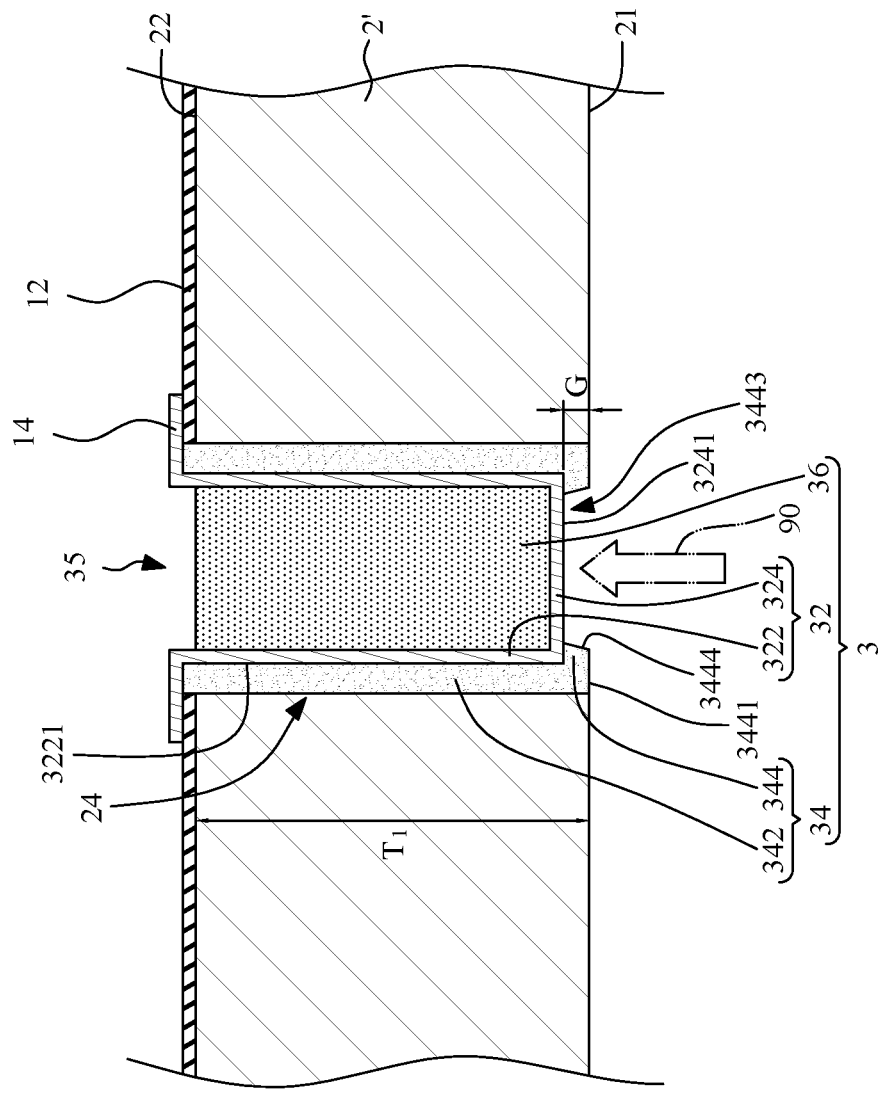
FIG. 9 illustrates one or more stages of an example of a method for manufacturing a semiconductor device according to some embodiments of the present disclosure.

Referring to FIG. 9, an opening 3443 is formed in the conductive via 3. For example, the opening 3443 is formed by using an energy beam such as laser beam 90. As shown in FIG. 9, the width of the laser beam 90 is less than the width of the opening 3443. In some embodiments, a portion of the second portion 344 of the first insulation layer 34 is removed to form the opening 3443 to expose a portion (e.g., the first portion 3241a of FIG. 3) of the end surface 3241 of the end portion 324 of the interconnection metal 32. Further, the second portion 344 of the first insulation layer 34 has and inner surface 3444 defining the opening 3443.

Figure 10:
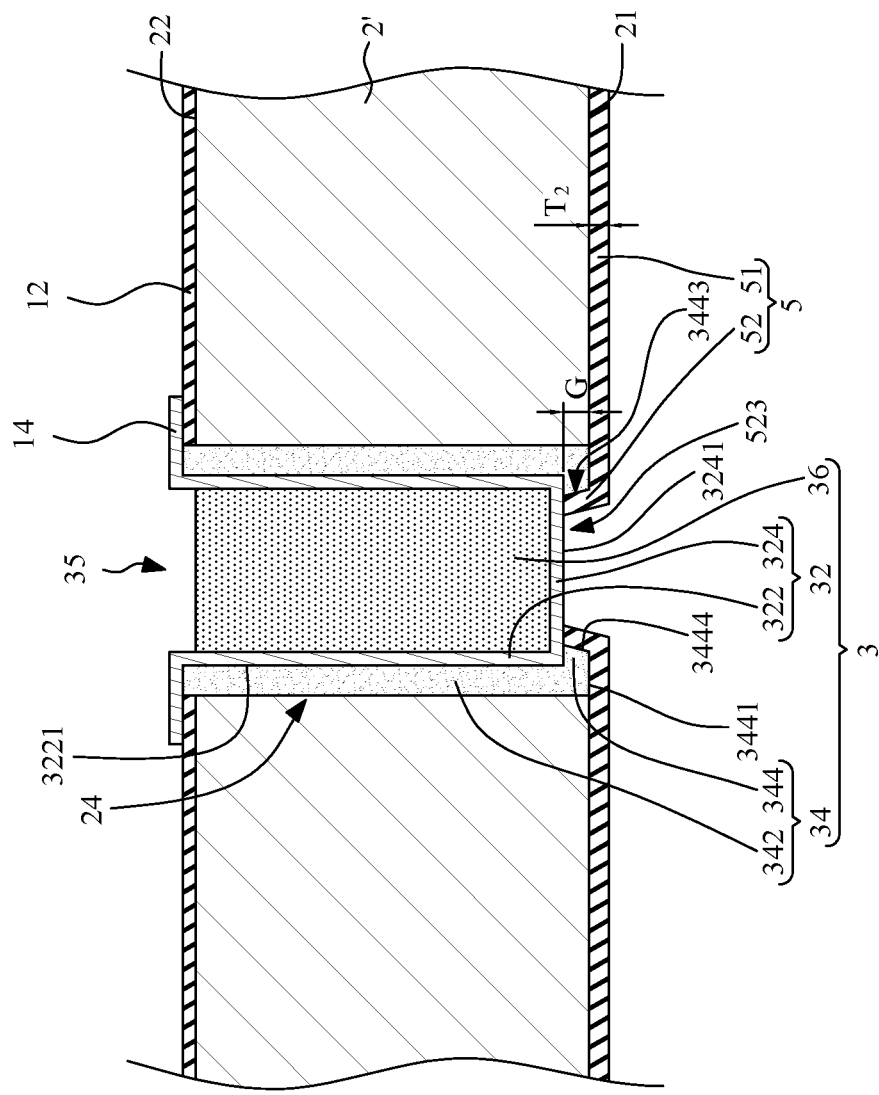
FIG. 10 illustrates one or more stages of an example of a method for manufacturing a semiconductor device according to some embodiments of the present disclosure.

Referring to FIG. 10, an second insulation layer 5 is formed or disposed on the first surface 21 of the semiconductor substrate 2' and in the opening 3443. The second insulation layer 5 may include a first portion 51 and a second portion 52. The first portion 51 of the second insulation layer 5 may be disposed on the first surface 21 of the semiconductor substrate 2 and the first surface 3441 of the second portion 344 of the first insulation layer 34. The second portion 52 of the second insulation layer 5 may be disposed on and cover the inner surface 3444 of the second portion 344. In addition, the second portion 52 of the second insulation layer 5 uncovers the exposed a portion (e.g., the first portion 3241a of FIG. 3) of the end surface 3241 of the end portion 324 of the interconnection metal 32. In some embodiments, the second portion 52 of the second insulation layer 5 in the opening 3443 may define a through hole (or a cavity) 523 to expose a portion (e.g., the first portion 3241a of FIG. 3) of the end surface 3241 of the interconnection metal 32.

Then, a conductive layer 4 (FIG. 1) is formed or disposed on the second insulation layer 5. The conductive layer 4 may be disposed adjacent to the first surface 21 of the semiconductor substrate 2 and electrically connected to the end surface 3241 of the interconnection metal 32. The conductive layer 4 may be electrically disconnected with the semiconductor substrate 2 by the second insulation layer 5 and electrically connected to the interconnection metal 32 of the at least one conductive via 3. The conductive layer 4 may include a main portion 41 and a via portion 42. The main portion 41 may be disposed adjacent to the first surface 21 of the semiconductor substrate 2, and may be disposed on the first portion 51 of the second insulation layer 5. The via portion 42 may connect the main portion 41 and the at least one conductive via 3. For example, the via portion 42 of the conductive layer 4 may be disposed in the through hole (or a cavity) 523 of the second insulation layer 5, and in the opening 3443 of the second portion 344 of the first insulation layer 34 to contact and electrically connect the exposed portion (e.g., the first portion 3241a of FIG. 3) of the end surface 3241 of the end portion 324 of the interconnection metal 32. Meanwhile, the semiconductor device 1 as shown in FIG. 1 is obtained.

Figure 11:
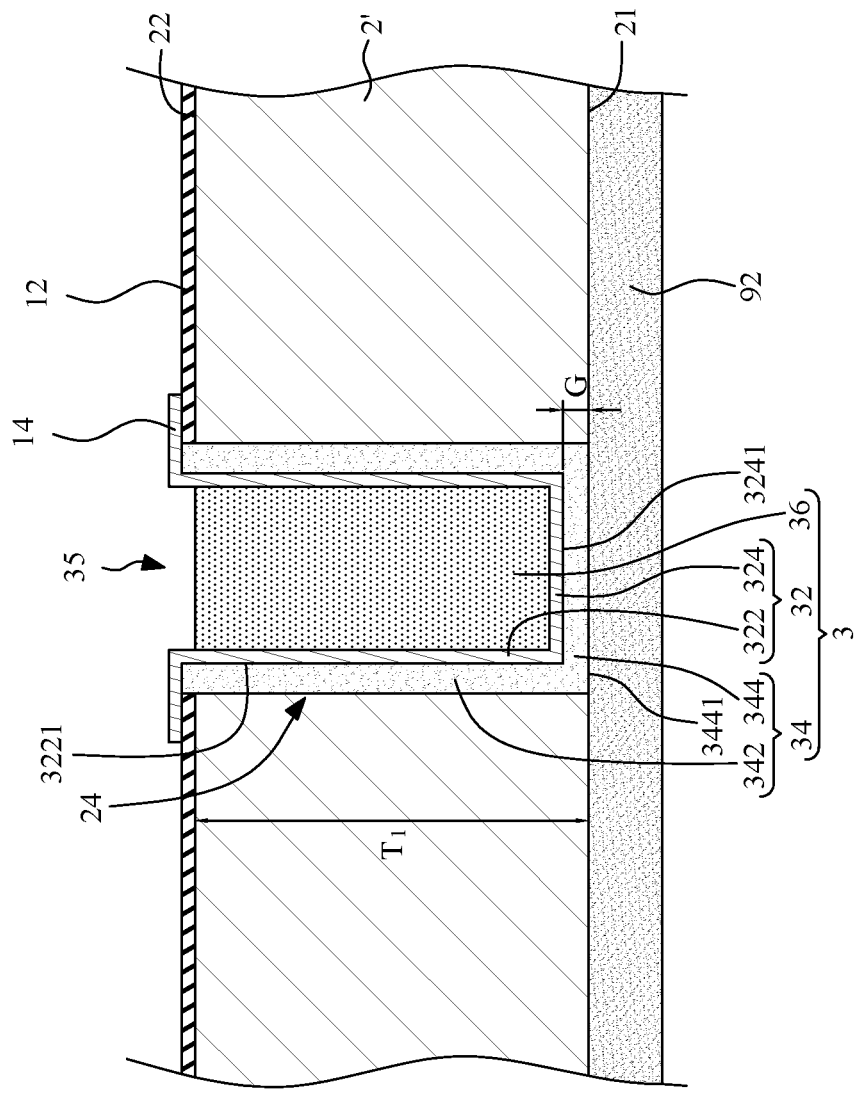
FIG. 11 illustrates one or more stages of an example of a method for manufacturing a semiconductor device according to some embodiments of the present disclosure.
Figure 12:
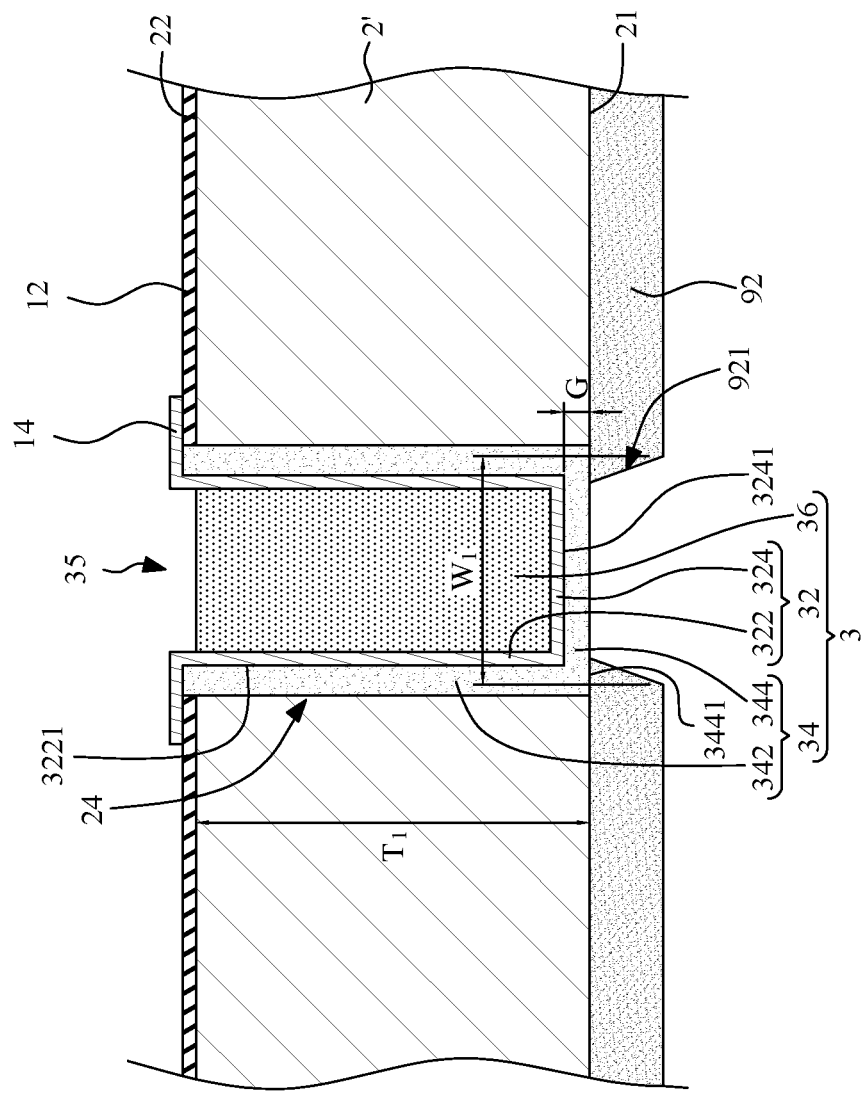
FIG. 12 illustrates one or more stages of an example of a method for manufacturing a semiconductor device according to some embodiments of the present disclosure.
Figure 13:
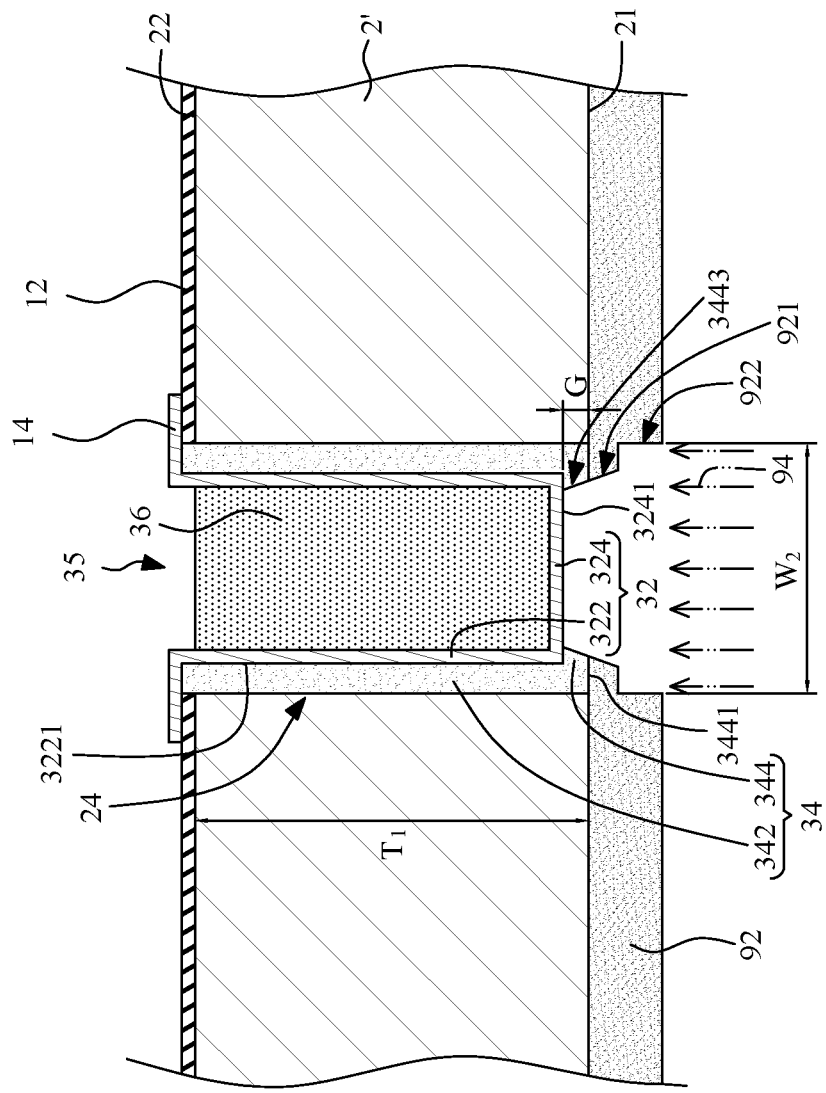
FIG. 13 illustrates one or more stages of an example of a method for manufacturing a semiconductor device according to some embodiments of the present disclosure.

FIG. 11 through FIG. 13 illustrates a method for manufacturing a semiconductor device according to some embodiments of the present disclosure. The initial stages of the illustrated process are the same as, or similar to, the stages illustrated in FIG. 6 to FIG. 8. FIG. 11 depicts a stage subsequent to that depicted in FIG. 8.

Referring to 11, a photoresist layer 92 is formed or disposed to cover the first surface 3441 of the second portion 344 of the first insulation layer 34 and the first surface 21 of the semiconductor substrate 2'.

Referring to 12, a through hole 921 is formed in the photoresist layer 90 to expose a portion of the conductive via 3. For example, the through hole 921 extends through the photoresist layer 90 to expose a portion of the first surface 3441 of the second portion 344 of the first insulation layer 34 of the conductive via 3. The through hole 921 has a width $W_1$.

Referring to FIG. 13, an opening 3443 is formed in the conductive via 3. For example, the opening 3443 is formed by using an energy beam such as laser beam 94. Meanwhile, the photoresist layer 90 serves as a mask, and the opening 3443 is formed through the through hole 921 is formed in the photoresist layer 90. As shown in FIG. 13, the width $W_2$ of the laser beam 94 is greater than the width $W_1$ of the through hole 921. In some embodiments, the laser beam 94 may form an opening 922 in the photoresist layer 90.

Then, the photoresist layer 90 is removed, and the following stages of the method may be similar to the stages illustrated in FIG. 10 to FIG. 11 so as to obtain the semiconductor device 1 as shown in FIG. 1.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device, comprising:
   a semiconductor substrate;
   at least one conductive via disposed in the semiconductor substrate and including an interconnection metal and a first insulation layer around the interconnection metal, wherein a portion of the first insulation layer defines an opening to expose the interconnection metal;
   a second insulation layer disposed on a surface of the semiconductor substrate and in the opening; and
   a conductive layer electrically disconnected with the semiconductor substrate by the second insulation layer and electrically connected to the interconnection metal of the at least one conductive via;

wherein a surface roughness of an exposed portion of an end surface of the interconnection metal is different from a surface roughness of a portion outside the exposed portion of the end surface of the interconnection metal.

2. The semiconductor device of claim 1, wherein the portion of the first insulation layer has and inner surface defining the opening, and the second insulation layer covers the inner surface of the portion of the first insulation layer.

3. The semiconductor device of claim 1, wherein the second insulation layer contacts the end surface of the interconnection metal.

4. The semiconductor device of claim 1, wherein a portion of the second insulation layer is disposed between the end surface of the interconnection metal and the conductive layer.

5. The semiconductor device of claim 1, wherein a portion of the first insulation layer is disposed between the end surface of the interconnection metal and the conductive layer.

6. The semiconductor device of claim 1, wherein the opening tapers toward the end surface of the interconnection metal.

7. The semiconductor device of claim 1, wherein a portion of the second insulation layer in the opening defines a through hole to expose the exposed portion of the end surface of the interconnection metal.

8. The semiconductor device of claim 7, wherein a portion of the conductive layer is disposed in the through hole of the second insulation layer to contact the exposed portion of the end surface of the interconnection metal.

9. A semiconductor device, comprising:
a semiconductor substrate having a first surface and a second surface;
at least one conductive via disposed in the semiconductor substrate, and including an interconnection metal and a first insulation layer around the interconnection metal, wherein a portion of the first insulation layer has a first surface substantially coplanar with the first surface of the semiconductor substrate and non-coplanar with an end surface of the interconnection metal;
a conductive layer disposed adjacent to the first surface of the semiconductor substrate and electrically connected to the end surface of the interconnection metal; and
a second insulation layer interposed between the semiconductor substrate and the conductive layer, wherein a portion of the second insulation layer extends into the at least one conductive via to contact the interconnection metal of the at least one conductive via the second insulation layer is in contact with the semiconductor substrate, the first insulation layer and the interconnection metal, the second insulation layer has a first top surface and a second top surface, an elevation of the first top surface is substantially equal to an elevation of the first surface of the semiconductor substrate, an elevation of the second top surface is higher than the elevation of the first top surface, and a roughness of the first top surface of the second insulation layer is less than a roughness of the second top surface of the second insulation layer.

10. The semiconductor device of claim 9, wherein a portion of the conductive layer extends into the at least one conductive via to contact the end surface of the interconnection metal.

11. The semiconductor device of claim 9, wherein the portion of the first insulation layer is disposed around the portion of the conductive layer.

12. The semiconductor device of claim 10, wherein the second insulation layer covers the portion of the first insulation layer.

13. The semiconductor device of claim 10, wherein the second insulation layer has a lateral surface in contact with the first insulation layer and the interconnection metal.

14. The semiconductor device of claim 9, wherein the portion of the first insulation layer is disposed under the end surface of the interconnection metal.

15. The semiconductor device of claim 14, wherein the portion of the first insulation layer has a lateral surface under the end surface of the interconnection metal, and the lateral surface is not perpendicular to the end surface of the interconnection metal.

* * * * *